United States Patent [19]
Takeuchi

[11] Patent Number: 5,886,927
[45] Date of Patent: Mar. 23, 1999

[54] NONVOLATILE MEMORY DEVICE WITH VERIFY FUNCTION

[75] Inventor: Nobuyoshi Takeuchi, Tokyo, Japan

[73] Assignee: NKK Corporation, Japan

[21] Appl. No.: 11,450

[22] PCT Filed: Jun. 11, 1997

[86] PCT No.: PCT/JP97/02006

§ 371 Date: Jul. 9, 1998

§ 102(e) Date: Jul. 9, 1998

[30] Foreign Application Priority Data

Jun. 11, 1996 [JP] Japan .................................. 8-149005
  Jun. 26, 1996 [JP] Japan .................................. 8-166116

[51] Int. Cl.$^6$ ............................................. G11C 16/06
[52] U.S. Cl. ............................. 365/185.22; 365/185.2; 365/185.24
[58] Field of Search ..................... 365/185.22, 185.2, 365/185.21, 185.24, 185.3, 185.12

[56] References Cited

U.S. PATENT DOCUMENTS 5,408,432  4/1995  Watanabe ........................... 365/189.05
5,629,892  5/1997  Tang ...................................... 365/185.2
5,671,180  9/1997  Higuchi .............................. 365/185.21
5,675,536  10/1997 Sim .................................... 365/185.22

FOREIGN PATENT DOCUMENTS

A 6-28899   2/1994  Japan .
A 7-50096   2/1995  Japan .
A 7-182875  7/1995  Japan .

Primary Examiner—Son Mai
Attorney, Agent, or Firm—Nixon & Vanderhye

[57] ABSTRACT

One verify cell is connected to one word line, together with a plurality of array cells, and has a threshold value almost the same as the array cells. A write voltage or an erase voltage is applied to the array cells, setting the voltage applied to the verify cell at a small value, thereby electrically changing the threshold value of the verify cell. Alternatively, the sense ratio of a sense amplifier is changed with respect to the output of the verify cell and the output of a reference cell, thereby electrically changing the apparent threshold value of the verify cell. Data is thereby written into or erased from the array cells earlier than into or from the verify cell. Hence, the verification of the memory cells is accomplished by when the verify cell is verified.

15 Claims, 11 Drawing Sheets

NONVOLATILE MEMORY DEVICE WITH VERIFY FUNCTION

TECHNICAL FIELD

The present invention relates to a nonvolatile memory device and, more particularly a nonvolatile memory device which has verify function and which comprises memory cells for verification (hereinafter referred to as "verify cells") in addition to a plurality of memory cells connected to word lines.

BACKGROUND ART

With a nonvolatile memory device such as an EEPROM or a flash memory, it must be confirmed whether data has been correctly written into the memory device after the data-writing operation or has been erased therefrom after the data-erasing operation. This confirmation step shall be called "verification." Hitherto, verification has been performed, first by reading data items from the memory cells (i.e., array cells) of a nonvolatile memory device, one by one, and then by comparing each data item with the contents of the memory cell transistor (i.e., reference cell transistor).

In a nonvolatile memory device such as an EEPROM or a flash memory, for example, data is written or erased for a prescribed time, and then it is determined whether or not the data has been correctly written or erased. If NO, the data is written or erased repeatedly, each time for the prescribed time, until it is confirmed that the data has been correctly written or erased.

This method of verification is to read the data items from the memory cells (i.e., array cells) of the nonvolatile memory device, one by one, and then by comparing each data item with the contents of the memory cell transistor (i.e., reference cell transistor), after the data is actually written into or erased from the memory cells.

Recently the integration density of memories has increased, and the number of memory cells incorporated in each memory has increased. It therefore takes much time and labor to examine the threshold values of the memory cells, one by one.

U.S. Pat. No. 5,142,496, for example, discloses the technique of conducting verification. In this technique, a reference column is provided at an end of the cell matrix, the sense ratio set in a sense circuit is adjusted, and the outputs from the array cells are compared with the output of the reference cell connected to the same word line as the array cells.

Since one reference cell is connected to each word line, the characteristic of any array cell connected to the same word line can be determined when the reference cell is verified.

In the invention of U.S. Pat. No. 5,142,496, a sense amplifier compares the outputs from the array cells with the output of the reference cell connected to the same word line. To verify the array cells it is necessary to select the array cells which have been selected to write data items, and to compare the contents of the array cells with those of the reference cell. Even if data is written, for example, in page mode and thus in unit of a word line, at least the contents of the array cells selected must be compared with those of the reference cell. It would take time to select one or more of the memory cells. Much time is inevitably required to perform verification.

Further, the reference cells connected to the word lines, one to each word line, differ in characteristic, which is inevitable due to the manufacturing process. Consequently, the verification standard between the reference cells must be changed for each word line.

As described above, with the conventional nonvolatile memory device it is necessary to verify all memory cells selected to confirm that data has been correctly written into or erased from the memory cells incorporated in the array. The verification requires much time and labor.

DISCLOSURE OF INVENTION

Accordingly it is the object of the present invention to provide a nonvolatile memory device with verify function, in which verification can be conducted fast and accurately, thereby to write and erase data with ease and at high speed.

A nonvolatile memory device with verify function, according to the invention, comprises a plurality of word lines arranged in row direction; a plurality of bit lines arranged in column direction, intersecting with the word lines; a plurality of nonvolatile memory cells provided at the intersections of the word lines and bit lines; at least one nonvolatile verify cell connected to one word line, along with some nonvolatile memory cells, and having substantially the same threshold value as the nonvolatile memory cells; threshold control means for electrically decreasing the threshold value of the nonvolatile verify cell by a predetermined value with respect to the threshold value of the nonvolatile memory cells, before data-writing operation or data-erasing operation; and verification means for verifying the contents of the nonvolatile verify cell upon lapse of a predetermined time from the changes in threshold value made by the threshold control means.

Another nonvolatile memory device with verify function, according to the invention, comprises a plurality of word lines arranged in row direction; a plurality of bit lines arranged in column direction, intersecting with the word lines; a plurality of nonvolatile memory cells provided at the intersections of the word lines and bit lines; at least one nonvolatile verify cell connected to one of said plurality of word lines, along with some nonvolatile memory cells; means for applying a prescribed voltage to the nonvolatile memory cells to write or erase data and for applying a voltage lower than this voltage to the nonvolatile verify cell; and means for verifying the contents of the nonvolatile verify cell upon lapse of a predetermined time.

In the memory device of the structures described above, a prescribed voltage is applied to the nonvolatile memory cells to write or erase data, and a voltage lower than this voltage is applied to the nonvolatile verify cell. Hence, when data is written into or erased from the nonvolatile verify cell, data has already been written into or erased from the nonvolatile memory cells. When the contents of the nonvolatile verify cell is verified, it has already been verified that data items have been written into or erased from the nonvolatile memory cells.

Still another nonvolatile memory device with verify function, according to this invention, comprises a plurality of word lines arranged in row direction; a plurality of bit lines arranged in column direction, intersecting with the word lines; a plurality of nonvolatile memory cells provided at the intersections of the word lines and bit lines; at least one nonvolatile verify cell connected to one word line, along with the nonvolatile memory cells, and having substantially the same write and erase characteristic as the nonvolatile memory cells; a reference cell for generating a reference signal; and sense means for detecting the output of the verify cell connected to the word line selected to write or erase data and also the reference signal output from the reference cell, with different sensitivities, respectively.

In this memory device of the structure described above, each nonvolatile verify cell connected to one word line, along with some nonvolatile memory cells, and having substantially the same write and erase characteristic as the nonvolatile memory cells, and the reference cell are used to verify the nonvolatile memory cells connected to the word line. In other words, the memory cells can be verified at high speed, in units of word lines or in units of pages.

Furthermore, with the above-described structure it is possible to control the sensitivity of the sense means electrically, in order to adjust the threshold value of the cells. The verification can therefore be carried out fast and accurately. Moreover, since the sense means has a simple circuit structure and the verify cells can be made at the same time as the nonvolatile memory cells, they can be manufactured by using the existing manufacturing process, without modifying the process. Therefore, the device can have a small chip area and can be manufactured at low cost.

BEST MODE OF CARRYING OUT THE INVENTION

The first embodiment of the present invention will now be described, with reference to the accompanying drawings.

Figure 1:
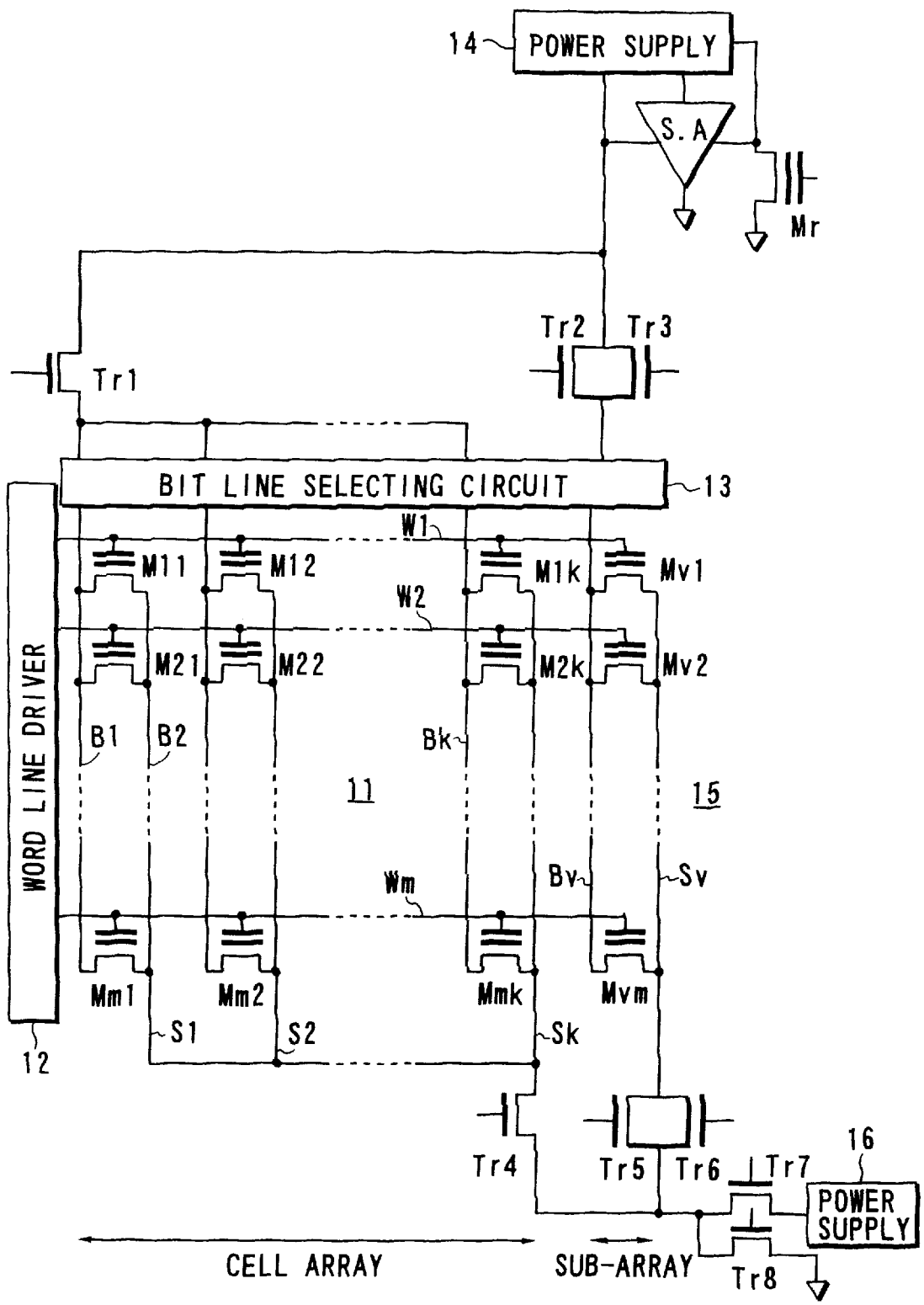
FIG. 1 is a block diagram showing the circuit structure of an embodiment of this invention.

FIG. 1 is a block diagram showing the first embodiment. This embodiment has a memory cell array 11. The array 11 comprises a plurality of nonvolatile memory cell transistors M11, M12, . . . M1k, M21, M22, . . . M2k, . . . Mm1, Mm2, . . . Mmk arranged in rows and columns, forming a matrix. The control gates of the nonvolatile memory cells M11, M12, . . . M1k are connected to the first word line W1, and control gates of the nonvolatile memory cell transistors M21, M22, . . . M2k are connected to the second word line W2. The control gates of the nonvolatile memory cell transistors Mm1, Mm2, . . . Mmk are connected to the word line Wm. The word lines W1 to Wm are connected to the output terminal of a word line driver 12 and are driven by the driver 12.

The drains of the nonvolatile memory cell transistors M11, M21, . . . Mm1 are connected to the first bit line B1. The drains of the nonvolatile memory cell transistors M12 M22, . . . Mm2 are connected to the second bit line B2. The drains of the nonvolatile memory cell transistors M1k, . . . M2k, Mmk are connected to the kth bit line Bk. The bit lines B1 to Bk are connected to a bit line selecting circuit 13, which is connected to a drive transistor Tr1. The drive transistor Tr1 is connected to a power supply 14. The sources of the nonvolatile memory cell transistors M11, M21, . . . Mm1 are connected to the first source line S1. The sources of the nonvolatile memory cell transistors M12, M22, . . . Mm2 are connected to the second source line S2. The sources of the nonvolatile memory cell transistors M1k, M2k, . . . Mmk are connected to the kth source line Sk. The source lines S1 to Sk are connected to the drain of a transistor Tr4.

In addition to the memory cell array 11 thus structured, a sub-array 15 is provided which comprises sub-memory cells. The sub-array 15 is used to perform verification. It shall therefore be referred to as "verify cell array" in the following description. The verify cell array 15 comprises verify cell transistors Mv1, Mv2, . . . Mvm which are provided for the word lines W1, W2, . . . , Wm, respectively. The verify cell transistors Mv1, Mv2, . . . Mvm have their control gates connected to the word lines W1, W2, . . . Wm, respectively. Their drains are connected via a bit line Bv to the bit line selecting circuit 13. The circuit 13 is connected to drive transistors Tr2 and Tr3 which are connected in parallel to each other. The drive transistors Tr2 and Tr3 are connected to the power supply 14. The sources of the verify cell transistors Mv1, Mv2, . . . Mvm are connected to a source line Sv. The source line Sv is connected to the drains of transistors Tr5 and Tr6, which are connected in parallel to each other.

The source of the transistor Tr4 is connected to the drains of the transistors Tr5 and Tr6. The sources of the transistors Tr5 and Tr6 are connected, each to the drains of the transistors Tr5 and Tr6. The source of the transistor Tr7 is connected to the positive terminal of a power supply 16. The source of the transistor Tr8 is connected to the ground.

As will be detailed later, the transistor Tr7 is turned on, applying the positive voltage from the power supply 16 to the sources of the verify cell transistors Mv1, Mv2, . . . Mvm constituting the verify cell array 15. Electrons are thereby injected into floating gates to write data, by using hot electrons in programming method, i.e., hot electron programming method. Alternatively, electrons are thereby pulled from the floating gates to erase data, by using a Fowler-Nordheim tunnel current in the Fowler-Nordheim (F-N) electron pulling method.

The transistor Tr8 is turned on, achieving electron injection (i.e., F-N electron injection), by using a Fowler-Nordheim tunnel current. The sources of the verify cell transistors Mv1, Mv2, . . . Mvm are thereby connected to the ground by the transistor Tr6.

The transistors Tr1, Tr2 and Tr3 are connected to one input terminal of a sense amplifier SA. The other input terminal of the sense amplifier SA is connected to the drain of a reference cell transistor Mr, which will be detailed later. The sense amplifier SA is connected between the power supply 14 and the ground. So is the reference cell transistor Mr.

The nonvolatile memory cell transistors M11 to Mmk constituting the memory cell array 11 and the verify cell transistors Mv1, Mv2, . . . Mvm constituting the verify cell array 15 are provided on one semiconductor substrate, together with the other circuit elements of the arrays 11 and 15. The nonvolatile memory cell transistors M11 to Mmk and verify cell transistors Mv1, Mv2, . . . Mvm have the same structure and the same size.

They have been formed simultaneously in the same manufacturing step. They are therefore memory cells identical in characteristic. Data can be written into and erased from them in the same period of time, provided that the same data-writing voltage and the same data-erasing voltage are applied to them. Thus it can be understood that, if the voltage applied to the verify cell array 15 is lower than the voltage applied to the memory cell array 11, the time required to write and erase data into and from the memory cell array 11 will be shorter. Verification is performed on the basis of this point in the present embodiment, as will be described below in detail.

Figure 2:
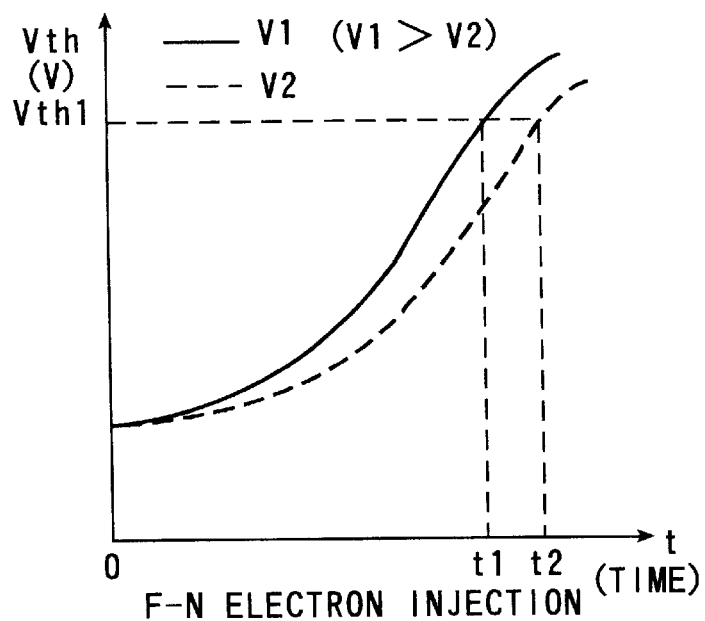
FIG. 2 is a graph illustrating how the threshold value of each memory cell changes with the write voltage applied to the memory cell.

FIG. 2 illustrates the write characteristic which the nonvolatile memory cell transistors M11 to Mmk and the verify cell transistors Mv1, Mv2, . . . Mvm exhibit when the drain voltages are different, while the word line voltage and the source voltage are maintained constant, to write data into these cell transistors by achieving electron injection (i.e., F-N electron injection), using a Fowler-Nordheim tunnel current.

In FIG. 2, the solid line indicates the drain voltage V1 of the nonvolatile memory cell transistors M11 to Mmk, and the broken line indicates the drain voltage V2 of the verify cell transistors Mv1, Mv2, . . . Mvm. Voltages V1 and V2 are set to have relationship of: V1>V2.

In order to set this relationship, an ON signal is supplied to the gates of the transistors Tr1, Tr2, Tr4, Tr6 and Tr8 of the circuit shown in FIG. 1, thereby turning on these transistors, while an OFF signal is supplied to the gates of the transistors Tr3, Tr5 and Tr7 of the circuit, thereby turning off these transistors. As a result, the sources of the nonvolatile memory cell transistors M11 to Mmk connected between the bit line selecting circuit 13 and the power supply 14 are connected to the ground. In this condition, the drive ability of the drain-driving transistor Tr1 is greater than that of the transistor Tr2 provided to drive the drains of the verify cell transistors Mv1, Mv2, . . . Mvm. The drain voltage V1 of the nonvolatile memory cell transistors M11 to Mmk, indicated by the solid line, is rendered higher than the drain voltage V2 of the verify cell transistors Mv1, Mv2, . . . Mvm, which is indicated by the broken line.

The drain voltages V1 and V2 are different as indicated above. Hence, the threshold value Vth of the nonvolatile memory cell transistors M11 to Mmk applied with the drain voltage V1 rises at a rate higher than does the threshold value Vth of the nonvolatile verify cell transistors Mv1, Mv2, . . . Mvm applied with the microscope drain voltage V2.

Generally, the writing of data into (or erasing data from) nonvolatile memory cell transistors is verified by repeatedly writing (or erasing) data for a predetermined time and then performing verification, several times.

Also, memory cells generally differ in their write (or erase) characteristic, inevitably because of the manufacture process. For instance, data writing does not complete at the same time in all selected ones of the memory cells connected to one word line. The time required to write data differs, from memory cell to memory cell. Data may be completely written in some memory cells when the nth writing operation is performed, whereas data may be completely written in some other memory cells when the (n+1)th writing operation is effected.

Thus, the nonvolatile memory cell transistors M11 to M1k connected to the word line W1 differ from one another in terms of write characteristic in the embodiment of FIG. 1. Nonetheless, data is completely written in any one of these memory cell transistor earlier than in the verify cell transistor Mv1. This is because a drain voltage is applied to the memory cell transistors, while a different drain voltage is applied to the verify cell transistor.

Assume that data is completely written in the nth writing operation ends at time t1 as is shown in FIG. 2 and that the nonvolatile memory cell transistors M11 to M1k acquire a threshold value Vth1 when data is completely written into them. The threshold values of the nonvolatile memory cell transistors M11 to M1k have already reached Vth1 due to a Fowler-Nordheim tunnel current (i.e., F-N electron injection), as the solid line indicates. Namely, writing operation has ended with respect to the word line W1.

At time t1, however, the threshold value Vth of the nonvolatile verify cell transistor Mv1 has not reached Vth1 as the broken line indicates in FIG. 2. Hence, it is detected that data has yet to be completely written into the verify cell transistor when the nth writing operation is carried out in verify mode.

When the (n+1)th writing operation is performed at time t2, upon lapse of a predetermined period from time t1, it is detected that the threshold value of the nonvolatile verify cell transistor Mv1 applied with the drain voltage V2 has just reached Vth1. It is therefore ascertained that the threshold values of the nonvolatile memory cell transistors M11 to M1k have reached Vth1 when the (n+1)th writing operation is carried out in verify mode. This means that data has already been completely written into the nonvolatile memory cell transistors M11 to M1k.

Assume that the threshold value of the nonvolatile verify cell transistor Mv2 applied with the drain voltage V2 has not reached Vth1 when the (n+1)th writing operation is effected. Also assume that the threshold value of the transistor Mv2 is detected to reach Vth1 when the (n+2)th writing operation is carried out. Then, it is ascertained that the threshold values of those of the nonvolatile memory cell transistors M11 to M1k which have been selected have also reached Vth1 when the (n+2)th writing operation is carried out in verify mode.

In the same way it is detected that the threshold value of any selected nonvolatile memory cell transistor connected to any other word line has already reached the value of Vth1, when the threshold value of the nonvolatile verify cell transistor connected to that word line reaches Vth1. It is confirmed that data has been completely written into the memory cell transistor.

As described above the drain voltage V1 of the nonvolatile memory cell transistors M11 to Mmk is higher than the drain voltage V2 of the verify cell transistors Mv1, Mv2, . . . Mvm. Data has therefore been completely written into the nonvolatile memory cell transistors M11 . . . Mmk at time t2 when data is written completely into the nonvolatile verify cell transistors Mv1, Mv2, . . . Mvm. Hence, the nonvolatile memory cell transistors M11 to Mmk has already been verified when the verify cell transistors Mv1, Mv2, . . . Mvm are verified at time t2.

The verification effected in the circuit shown in FIG. 1 will be explained in more detail. To perform the nth writing operation (n is 1 or an greater integer), the transistors Tr1, Tr2, Tr4, Tr6 and Tr8 are turned on, thereby connecting the cell array 11 and the verify cell array 15 are connected between the power supply 14 and the ground.

In order to accomplish programming, for example, in units of pages, the word lines W1 to Wm are sequentially driven by the word line driver 12. At the same time, the bit lines B1 to Bk are selectively driven in accordance with the data to be written. The nonvolatile memory cell transistors M11 to Mmk of the cell array 11 are selected by the bit line selecting circuit 13. On the other hand, all verify cell transistors Mv1, Mv2, . . . Mvm are set into data-written state.

At time t2 when data is completely written into, for example, the verify cell transistor Mv1 of the verify cell array 15, writing operation has already been finished with respect to the word line W1. This is because the transistor Tr1 has drive ability greater than that of the transistor Tr2 as mentioned above. The nth writing operation is switched to the nth verify mode. Only the transistors Tr3, Tr6 and Tr8 are thereby turned on.

The sense amplifier SA and the reference cell transistor Mr, both illustrated in FIG. 1, are used to verify the verify transistors Mv1, Mv2, . . . Mvm. The verify mode is set by turning on the transistors Tr3, Tr6, Tr8 and turning off the transistors Tr1, Tr2, Tr4, Tr5 and Tr7. Then, a prescribed current flows between the power supply 14 and the ground through the transistors Tr3 and Tr6, in accordance with the data items written in the verify cell transistors Mv1, Mv2, . . . Mvm, and a predetermined verify voltage is applied to one input terminal of the sense amplifier SA. A prescribed reference voltage is applied to the other input terminal of the sense amplifier SA from the reference cell transistor Mr. The sense amplifier SA compares these voltages. On the basis of the relationship between these voltages, it is possible to verify the writing in the verify cell transistors Mv1, Mv2, . . . Mvm.

Figure 3:
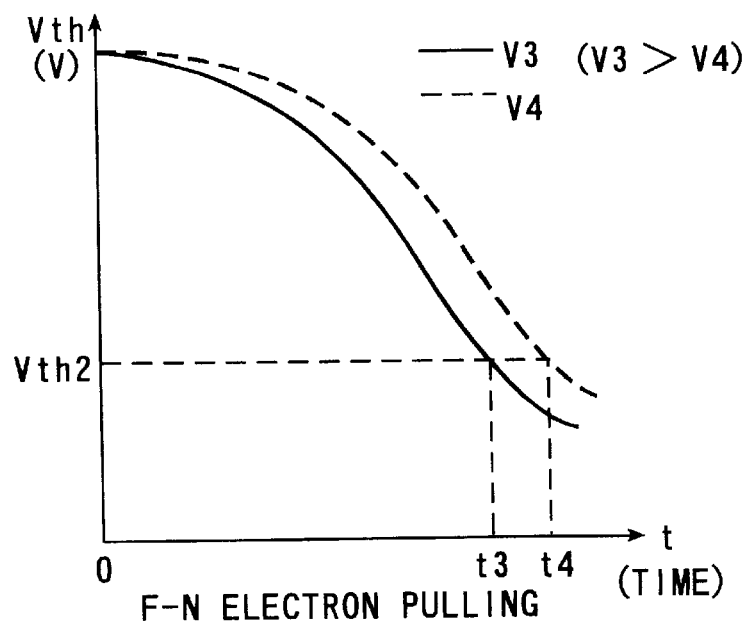
FIG. 3 is a graph demonstrating how the threshold value of each memory cell changes with the erase voltage applied to the memory cell.

How the embodiment operates in verify mode to erase data items from the nonvolatile memory cell transistors M11 to Mmk will be described. The data items are erased by setting the source voltage of the nonvolatile memory cell transistors M11 to Mmk at V3 and the source voltage of the verify cell transistors Mv1, Mv2, . . . Mvm at V4, as is illustrated in FIG. 3, thereby pulling electrons from the floating gates by using a Fowler-Nordheim tunnel current (F-N electron pulling. The source voltages V3 and V4 must have the relationship of: |V3|>|V4|. To this end, the transistors Tr4 and Tr5 are turned on, and greater drive ability is imparted to the transistor Tr4 than to the transistor Tr5. To erase the data items, the transistors Tr4, Tr5 and Tr8 are turned on, connecting the sources thereof to the ground.

FIG. 3 represents the erase characteristic (i.e., threshold value-time characteristic) which the memory cell transistors have when the drain voltage is changed, while the word line voltage and source voltage remain unchanged.

Assume that the nonvolatile memory cell transistors M11 to M1k acquire a threshold value Vth2 when data is completely erased from them. Then, the threshold values Vth of, for example, the nonvolatile memory cell transistors M11 to M1k connected to the word line W1 have already reached Vth2 as the solid line indicates in FIG. 3. This is because the transistor Tr4 has large drive ability at time t3 when the nth data erasing is completed by using a Fowler-Nordheim tunnel current (i.e., F-N electron pulling). The erasing of data for the transistors M11 to M1k is not directly verified as the writing of data.

At time t3, however, the threshold value Vth of the nonvolatile verify cell transistor Mv1 has not reached Vth2 as the broken line indicates, because the drive ability of the transistor Tr5 is insufficient. Hence, data has yet to be completely erased from the verify cell transistor. The threshold values of the nonvolatile verify cell transistors Mv1, Mv2, . . . Mvm applied with the source voltage V4 reach Vth2 at time t4 when the (n+1)th erasing operation is effected upon lapse of a prescribed period from time t3. Thus, data is completely erased from the verify cell transistors. The same holds true for the other word lines W2 to Wm.

As indicated above, the drain voltage V3 of the nonvolatile memory cell transistors M11 to Mmk is set higher than the drain voltage V4 of the verify cell transistors Mv1, Mv2, . . . Mvm. Therefore, data has already been erased from the nonvolatile memory cell transistors M11 to Mmk when data is completely erased from the nonvolatile verify cell transistors Mv1, Mv2, . . . Mvm. Thus, the transistors M11 to Mmk can be verified, too, if the erase mode is switched to the erase verify mode and the verify cell transistors Mv1, Mv2, . . . Mvm are verified.

In the erase verify mode, the sense amplifier SA and the reference cell transistor Mr, both shown in FIG. 1, are used to verify the verify cell transistors Mv1, Mv2, . . . Mvm. The erase verify mode is set by turning on the transistors Tr3, Tr6 and Tr8 and turning off the transistors Tr1, Tr2, Tr4, Tr5 and Tr7, as in the case of setting the write verify mode. In this condition, a current of a prescribed value flows between the power supply 14 and the ground via the transistors Tr3, Tr6 and Tr8 as the data is erased from the verify cell transistors Mv1, Mv2, . . . Mvm. As a result of this, a prescribed verify voltage is applied to the one input terminal of the sense amplifier SA. On the other hand, the prescribed reference voltage is applied to the other input terminal of the sense amplifier SA from the reference cell transistor Mr. The sense amplifier SA compares these voltages. On the basis of the relationship between these voltages, it is possible to verify the erasing of data from the verify cell transistors Mv1, Mv2, . . . Mvm. Namely, the verify voltage applied to the first input terminal of the sense amplifier SA is much lower than the reference voltage applied from the reference cell transistor Mr because the current flowing through the transistors Tr3 and Tr6 is smaller than the predetermined value if the data has been completely erased. The sense amplifier SA therefore outputs, for example, "0" upon comparing the voltages. Erase verification is thereby completed.

The write characteristics illustrated in FIG. 2 are observed when data is written by injecting electrons (F-N electron injection) by using a Fowler-Nordheim tunnel current. Nonetheless, data can be written by injecting hot electrons, as well. To write data by injecting hot electrons, the transistors Tr4, Tr5 and Tr7 are turned on, along with the transistors Tr1 and Tr2 shown in FIG. 1, thereby a positive voltage is applied from the power supply 16 to the sources of the nonvolatile memory cell transistors M11 to Mmk and also to the sources of the verify cell transistors Mv1, Mv2, . . . Mvm. In this case, the transistor Tr8 is turned off.

Figure 4:
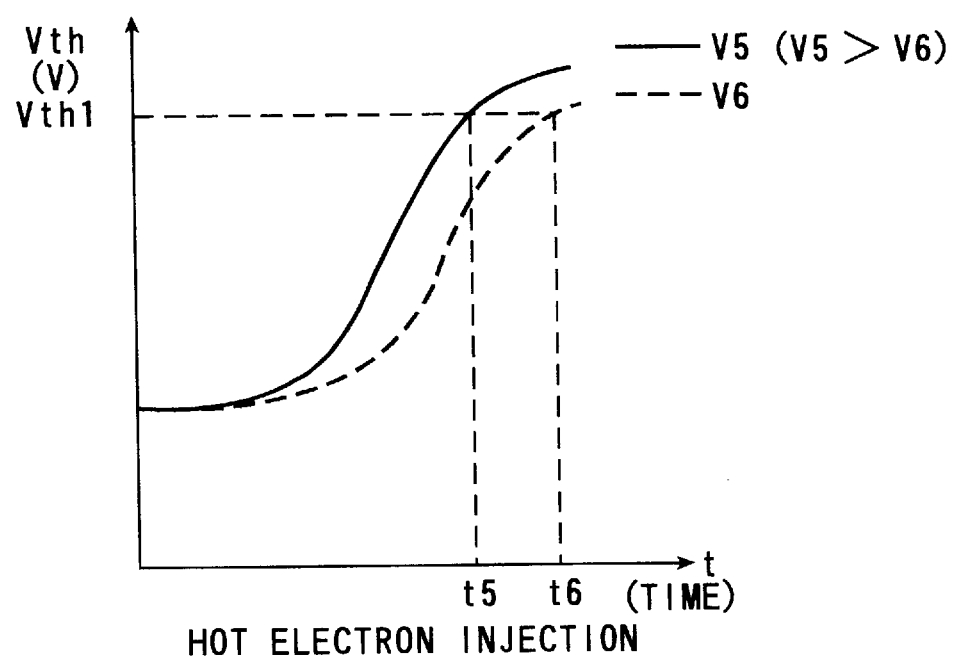
FIG. 4 is a graph representing how the threshold value of each memory cell changes with the write voltage applied to the memory cell to inject hot electrons into the memory cell.

FIG. 4 represents the write characteristics the transistors exhibit when hot electrons are injected into them. The drain voltage V5 of the nonvolatile memory cell transistors M11 to Mmk, for example, is set higher than the drain voltage V6 of the verify cell transistors Mv1, Mv2, . . . Mvm, and hot electrons are injected, thereby writing data.

In this case, too, the threshold values of the nonvolatile memory cell transistors M11 to Mmk applied with the higher drain voltage reach the write completion value Vth1 at time t5 as indicated by the solid line, whereas the threshold values of the verify cell transistors Mv1, Mv2, . . . Mvm reach the value Vth1 some time later, at time t6.

Hence, the write verification of the nonvolatile memory cell transistors M11 to Mmk can be accomplished easily as fast, only if they are so verified after the write verification is performed on the verify cell transistors Mv1, Mv2, . . . Mvm as in the case shown in FIG. 2.

Figure 5:
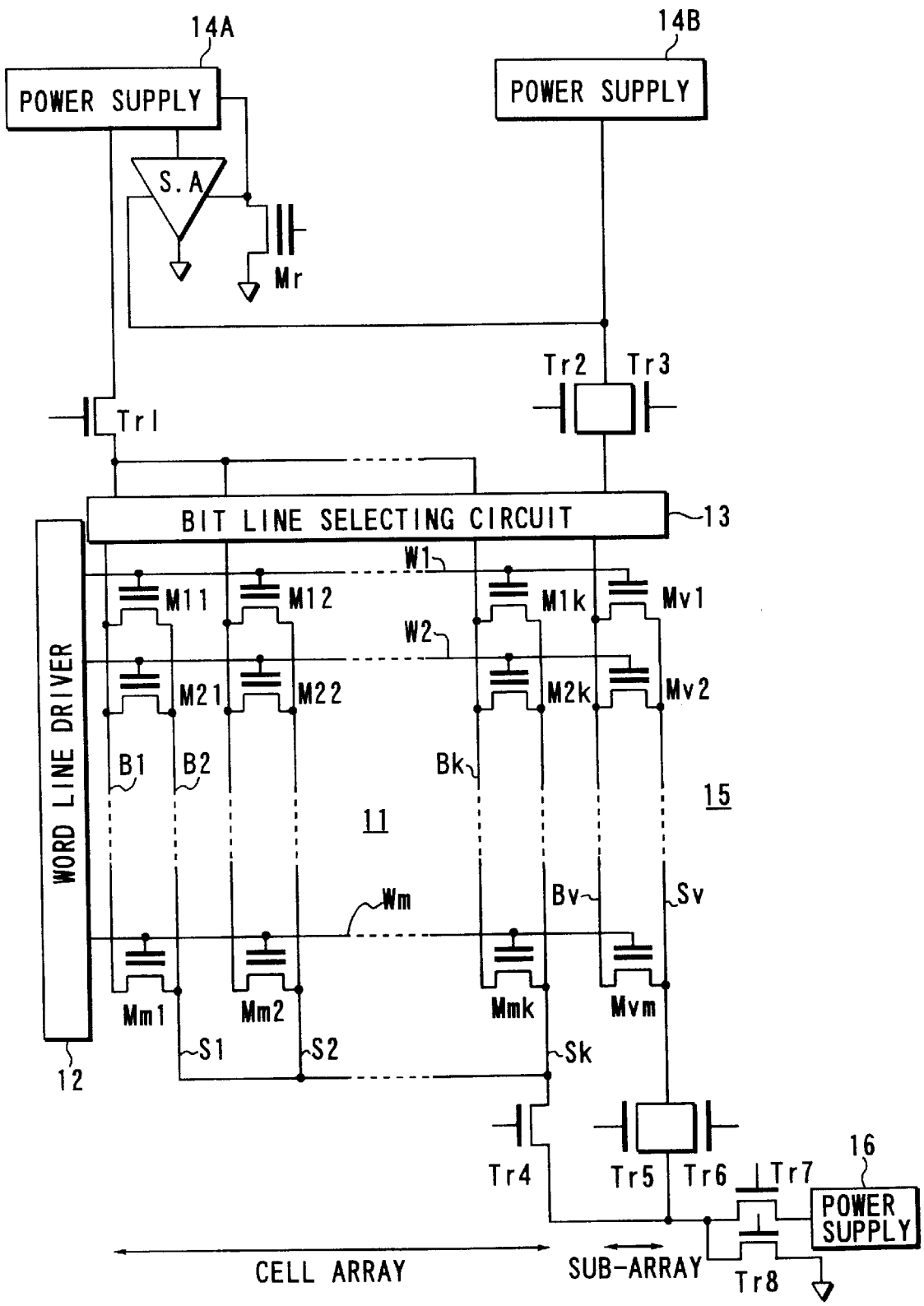
FIG. 5 is a block diagram showing the circuit structure of another embodiment of this invention.

In the first embodiment shown in FIG. 1, one power supply 14 is used to drive the drains of the nonvolatile memory cell transistors M11 to Mmk and also the drains of the verify cell transistors Mv1, Mv2, . . . Mvm. The transistor Tr1 has greater drive ability than the transistor Tr2 so that data is written into a cell array 11 earlier than into a verify cell array 15. If two power supplies are provided for the transistors Tr1 and Tr2, respectively, however, the restriction to the drive abilities of the transistors Tr1 and Tr2 will be eliminated. FIG. 5 is a block diagram of a memory device in which two power supplies are provided for the transistors Tr1 and Tr2. The components of the device shown in FIG. 5, which are identical to those shown in FIG. 1, are designated at the same reference numerals and will not be described.

As illustrated in FIG. 5, a power supply 14A is connected via a transistor Tr1 to a bit line selecting circuit 13, while a power supply 14B is connected via transistors Tr2 and Tr3 to the bit line selecting circuit 13. Therefore, the cell array 11 is driven by the power supply 14A via the transistor Tr1, and the verify cell array 15 is driven by the power supply 14B via the transistors Tr2 and T3. It is sufficient for the power supply 14A to apply a higher voltage to the bit lines B1 to Bk of the cell array 11 than does the power supply 14B. The transistors Tr1 and Tr2 may therefore have the same drive ability. To achieve write verification, however, it is necessary to drive the verify cell array 15 as much as the cell array 11 through the transistor Tr3. The transistor Tr3 must have the same drive ability as the transistor Tr1. It follows that the power is supplied from the power supply 14A to a sense amplifier SA and a reference cell transistor Mr as is illustrated in FIG. 5.

It is desired that the reference cell transistor Mr has a characteristic similar to those of the nonvolatile memory cell transistors M11 to Mmk which constitute the cell array 11. If so, changes in the condition of the reference cell transistor Mr indicate which condition the nonvolatile memory cell transistors M11 to Mmk assume in the write mode and the erase mode. In other words, it is desired that the reference cell transistor Mr operate at the same voltage as the non-volatile memory cell transistors M11 to Mmk. This is why the reference cell transistor Mr is connected to the power supply 14A for the transistor Tr1 connected to the cell array 11, in the embodiment of FIG. 5.

In this embodiment, as described above in detail, neither write verification nor erase verification is performed on the memory cells forming the cell array. Instead, verification is conducted on the verify cells applied with a voltage lower than the voltage applied to the memory cells. Hence, a nonvolatile memory device can be provided which has verify function for performing write verification and erase verification easily and quickly.

The second embodiment of the present invention will be described below.

Figure 6:
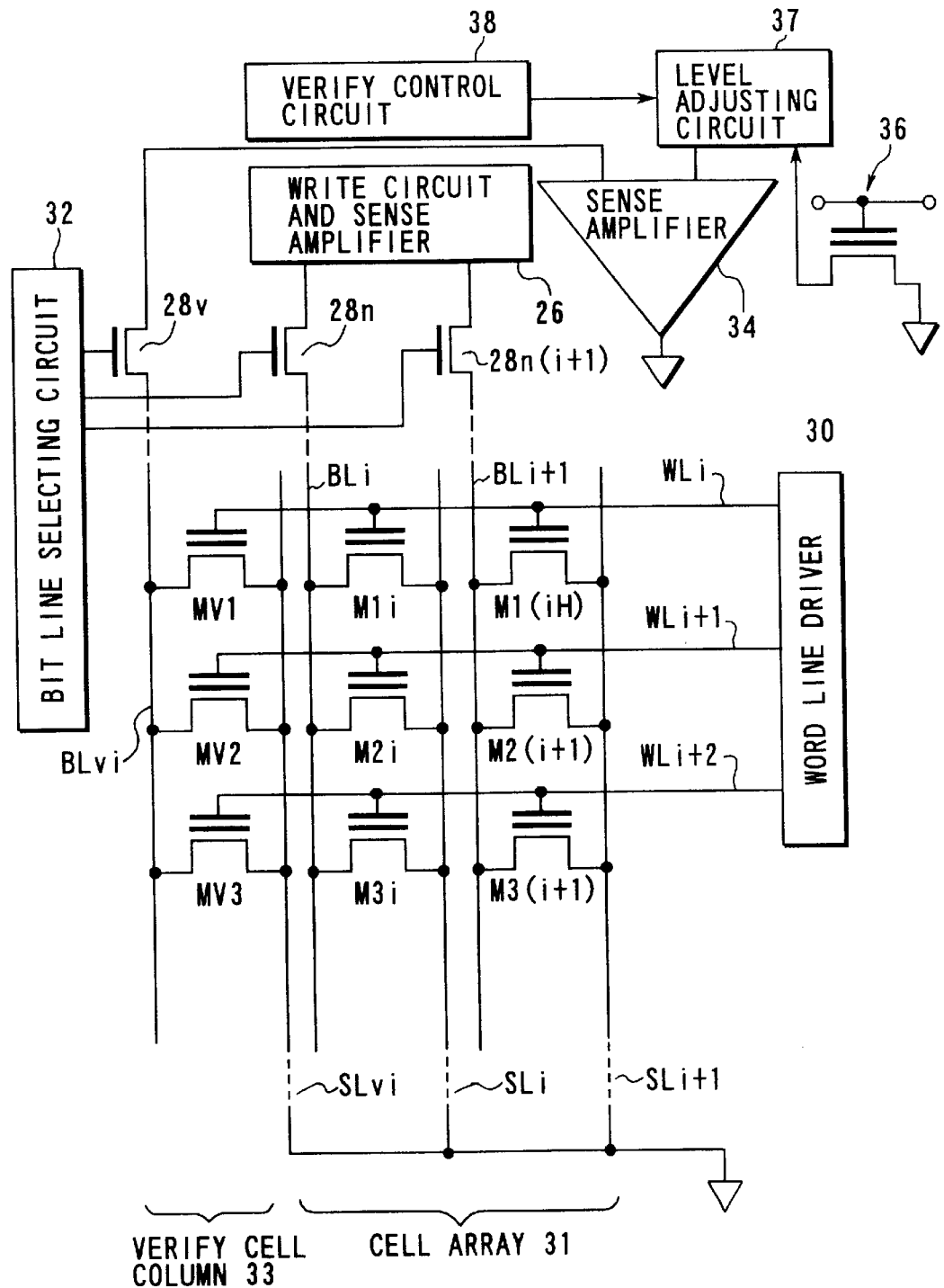
FIG. 6 is a block diagram depicting still another embodiment of the present invention.

FIG. 6 is a block diagram of the second embodiment. A memory cell array 31 comprises a plurality of nonvolatile memory cell transistors M1i, M1(i+1), . . . , M2i, M2(i+1), . . . , M3i, M3(i+1), . . . which are arranged in rows and columns, forming a matrix. The control gates of the nonvolatile memory cells M1i, M1(i+1), are connected to the first word line WLi. The control gates of the nonvolatile memory cell transistors M2i, M2(i+1) . . . are connected to the second word line WLi+1. The control gates of the nonvolatile memory cell transistors 3i, M3(i+1), . . . are connected to the word line WLi+2. The word lines WLi, WLi+1, WLi+2 are connected to the output terminal of an X decoder, i.e., a word line driver 30, which drives the memory cell transistors.

The drains of the nonvolatile memory cell transistors M1i, M2i, M3i, . . . are connected in common to the first bit line BLi. The drains of the nonvolatile memory cell transistors M1(i+1), M2(i+1), M3(i+1), are connected to the second bit line BLi+1. The bit lines BLi, BLi+1, are connected to the write circuit 26 by transistors 8ni and 8n(i+1). The transistors 8ni and 8n(i+1) are turned on and off by a Y decoder, i.e., bit line selecting circuit 32. The write circuit 26 includes a sense amplifier. The sources of the non-volatile memory cell transistors M1i, M2i, M3i, . . . are connected to the first source line SLi. The sources of the nonvolatile memory cell transistors M1(i+1), M2(i+1), M3(i+1), . . . are connected to the second source line SLi+1. The source lines SLi and SLi+1 are connected to the ground.

In addition to the memory cell array 31, a redundancy cell array 33 is provided. The array 33 comprises redundancy cells. The redundancy cell array 33 is used to verify the memory cell array 31 as will be explained later in detail. It shall therefore be referred to as "verify cell column 33" in the following description. The verify cell column 33 comprises redundancy cells, i.e., verify cell transistors Mv1, Mv2, Mv3, . . . Mvm. The control gates of the verify cell transistors Mv1, Mv2, Mv3, . . . are connected to the word lines WLi, WLi+1, WLi+2, . . . , respectively. Their drains are connected by a bit line BLvi to the source of a transistor 28v which is turned on and off by the bit line selecting circuit 32. The transistor 28v is connected to one input terminal of a sense amplifier 34. The sources of the verify cell transistors Mv1, Mv2, Mv3, . . . are connected to the ground.

The other input terminal of the sense amplifier 34 receives the output of a reference cell 36 through a level adjusting circuit 37. The level adjusting circuit 37 is driven by a signal supplied from a verify control circuit 38 in verify mode. The level adjusting circuit 37 adjusts the level of the output from the reference cell 36 to an appropriate value so that the output may be compared with the signal supplied from the verify cell column 33. The output thus level-adjusted is supplied to the sense amplifier 34.

In this embodiment, the nonvolatile memory cell transistors M1i to M3(i+1) constituting the memory cell array 31 and the verify cell transistors Mv1, Mv2, Mv3, . . . are formed on one semiconductor substrate, together with the other circuit elements of the array 31 and column 33. The nonvolatile memory cell transistors M1i to M3(i+1) and verify cell transistors Mv1, Mv2, Mv3, . . . have the same structure and the same size, because they have been formed simultaneously in the same manufacturing step. The reference cell 36 is also formed at the same time. They are therefore memory cells identical in characteristic. Data can be written into and erased from them in the same period of time, provided that the same data-writing voltage and the same data-erasing voltage are applied to them. Stated in another way, changes in threshold value, which are observed in the memory cell array 31 can be detected by detecting the changes in threshold value which are observed in the verify cell column 33. Both write verification and erase verification can be performed on the memory cell transistors connected to each word line can be achieved by verifying the verify cell connected to the word line. Verification is effected on the basis of this point in the present embodiment, as will be described below in detail.

Figure 7:
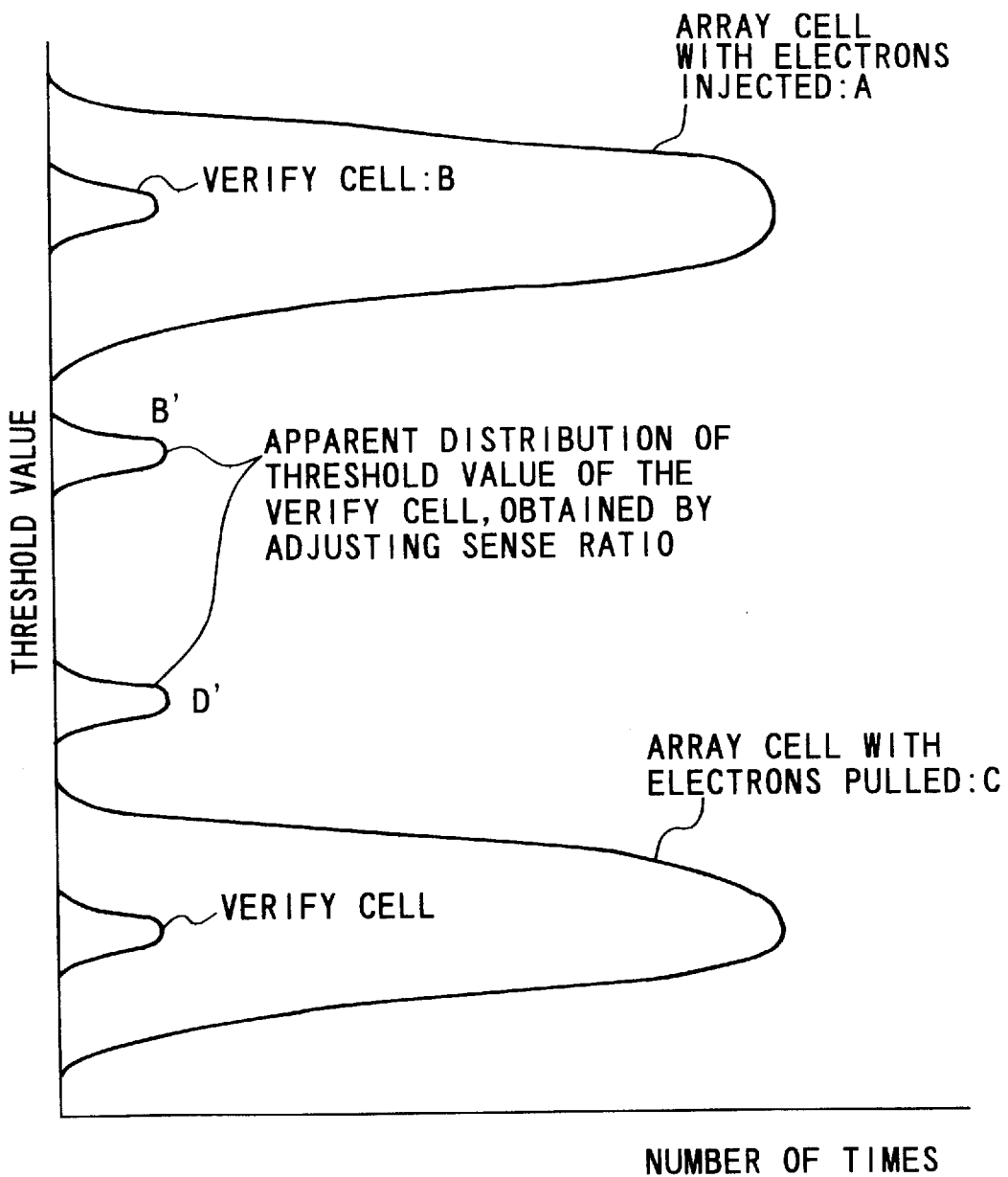
FIG. 7 is a graph explaining the operation of the embodiment shown in FIG. 6.

FIG. 7 shows the distribution of the write and erase characteristics which is observed when data is written into the nonvolatile memory cell transistors M1i to M3(i+1) and the verify cell transistors Mv1, Mv2, Mv3, . . . by injecting electrons (F-N electron injection) achieved by using a Fowler-Nordheim tunnel current, while the word line voltage, the drain voltage, the source voltage are held constant.

In FIG. 7, the curve A represents the threshold value distribution of the cells in the array 31 into which electrons have been injected for a predetermined time. The threshold value distribution of the verify cells of the column 33 is represented by the curve B which is located substantially in the middle part of the curve A. At this stage, the operating mode is switched to the verify mode. The level adjusting circuit 37 raises the level of the output of the reference cell 36, with respect to the level of the verify cells of the column 33. The raised output of the reference cell 36 is supplied to the sense amplifier 34, thus increasing the sense ratio to more than 1. The threshold value distribution of the verify cells of the column 33 then shifts to the curve B' located below the curve A. That is, the apparent threshold value distribution B' of the verify cells moves to a position below the threshold value distribution A of the array cells 31. Hence, if the output of the column 33 is level-adjusted by the level adjusting circuit 37, the threshold value of the array cells 31 must reach the position indicated by the curve A when the threshold value distribution B' of the verify cells of the column 33 is detected. Thus, write verification is effected on all memory cells connected to each word line, merely by verifying the verify cell connected to the word line. This means that verification can be accomplished in page mode at high speed.

The curve C shown in FIG. 7 represents the threshold value distribution which the memory cells 31 exhibit after electrons have been pulled for a prescribed time. The threshold value distribution of the verify cells of the column 33 is indicated by the curve D located substantially in the middle part of the curve C. At this stage, the operating mode is switched to the verify mode. The level adjusting circuit 37 lowers the level of the output of the reference cell 36, with respect to the level of the verify cells of the column 33. The output of the reference cell 36 is supplied to the sense amplifier 34, thus decreasing the sense ratio to less than 1. The threshold value distribution of the verify cells of the column 33 then shifts to the curve D' located above the curve C. That is, the threshold value distribution D' of the verify cells of the column 33 moves from the middle of the curve C to a position above the threshold value distribution C of the array cells 31. Hence, if the output of the column 33 is level-adjusted by the level adjusting circuit 37 so that the distribution D' may be detected, the threshold value of the array cells 31 must reach the position indicated by the curve C when the threshold value distribution D' of the verify cells of the column 33 is detected. Hence, erase verification is effected on all memory cells connected to each word line, merely by verifying the verify cell connected to the word line.

The embodiment shown in FIG. 6 comprises one cell array 31 and one verify cell column 33 provided for the cell array 31. Nevertheless, the memory cell array connected to each word line may be composed of a plurality of sectors, and a great number of memory cells may therefore be connected to the word line. Needless to say, in this case, too, it suffices to verify one verify cell to verify these memory cells.

Figure 8:
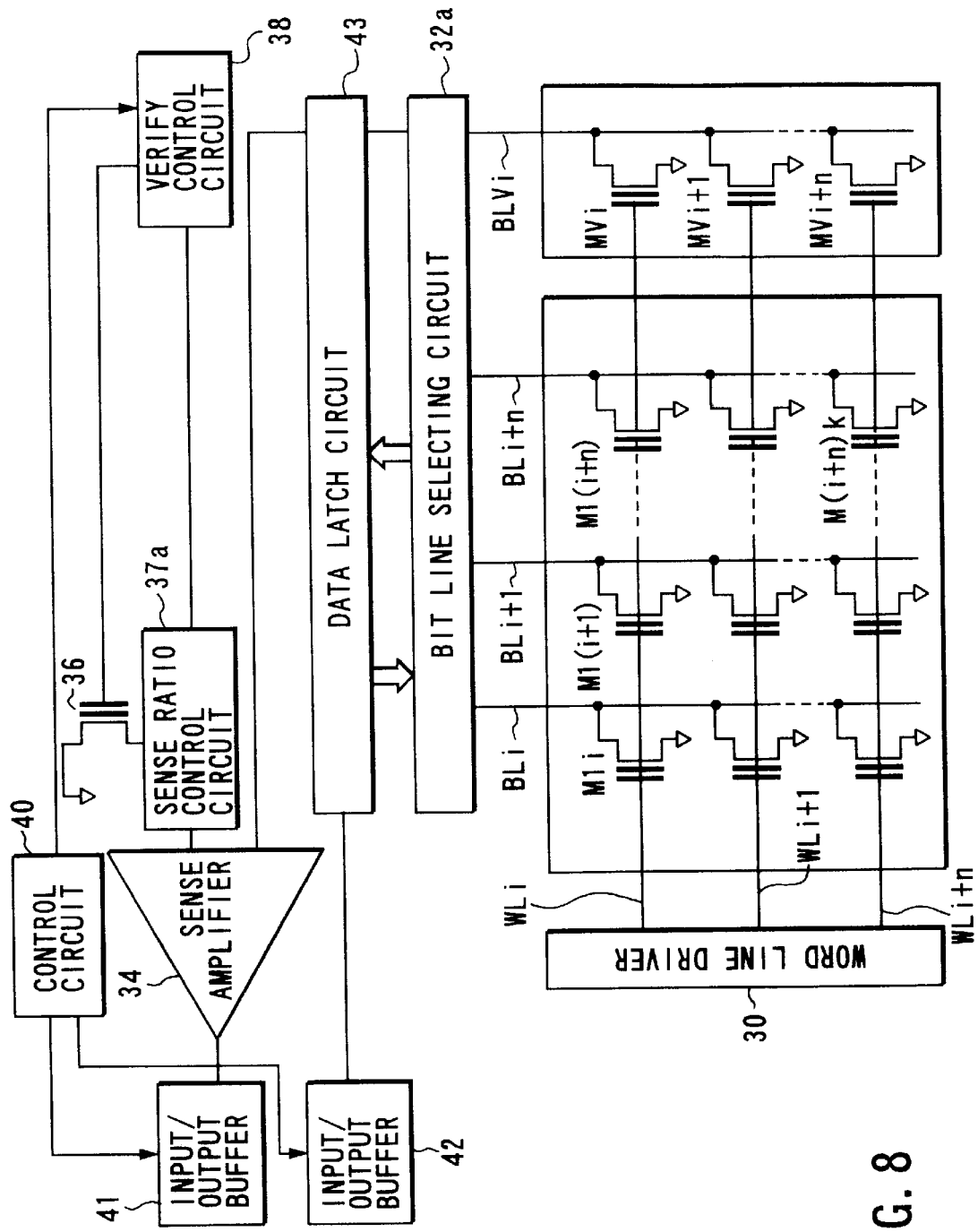
FIG. 8 is a block diagram illustrating another embodiment of the present invention.

FIG. 8 is a block diagram showing the embodiment of FIG. 6 in greater detail. In FIG. 8, the components which are identical to those shown in FIG. 6 are designated at the same or similar reference numerals. Only the different features will be explained. First, an input/output buffer 42 and a data latch circuit 43 replace the write circuit 26 shown in FIG. 6. Second, a sense ratio control circuit 37a is used in place of the level adjusting circuit 37. Third, the output of a sense amplifier 34 is supplied to an input/output buffer 41. Fifth, the input/output buffers 41 and 42 and a verify control circuit 38 operate under the control of a control circuit 40.

In the memory device of FIG. 8, the data latched from the input/output buffer 42 into the data latch circuit 43 is decoded by a bit line selecting circuit 32a in write mode. Bit lines BLi to BLi+n are selected, whereby the data is written into the selected ones of the memory cells connected to any word line that has been scanned by a word line driver 30.

When the operating mode is switched to verify mode upon lapse of a predetermined time, the verify control circuit 38 is operated by a control signal supplied from the control circuit 40 such as a CPU or the like. The output of a reference cell 36 is thereby amplified to a prescribed level by means of the sense ratio control circuit 37a. The output thus amplified is supplied to one input terminal of the sense amplifier 44. The other input terminal of the sense amplifier 34 receives an output of a verify cell column 33 which has been supplied through the bit line selecting circuit 32a and the data latch circuit 43. The sense amplifier 34 compares these inputs. As has been explained in conjunction with FIG. 2, if the output of the verify cell column 33 is detected at any point on the distribution curve B', it is determined that the threshold value of the cell array 31 is on the distribution curve A. Verification is thereby accomplished. In the erase mode, too, verification is effected as has been explained with reference to FIGS. 6 and 7. How the verification is achieved in the erase mode is not described here.

Figure 9:
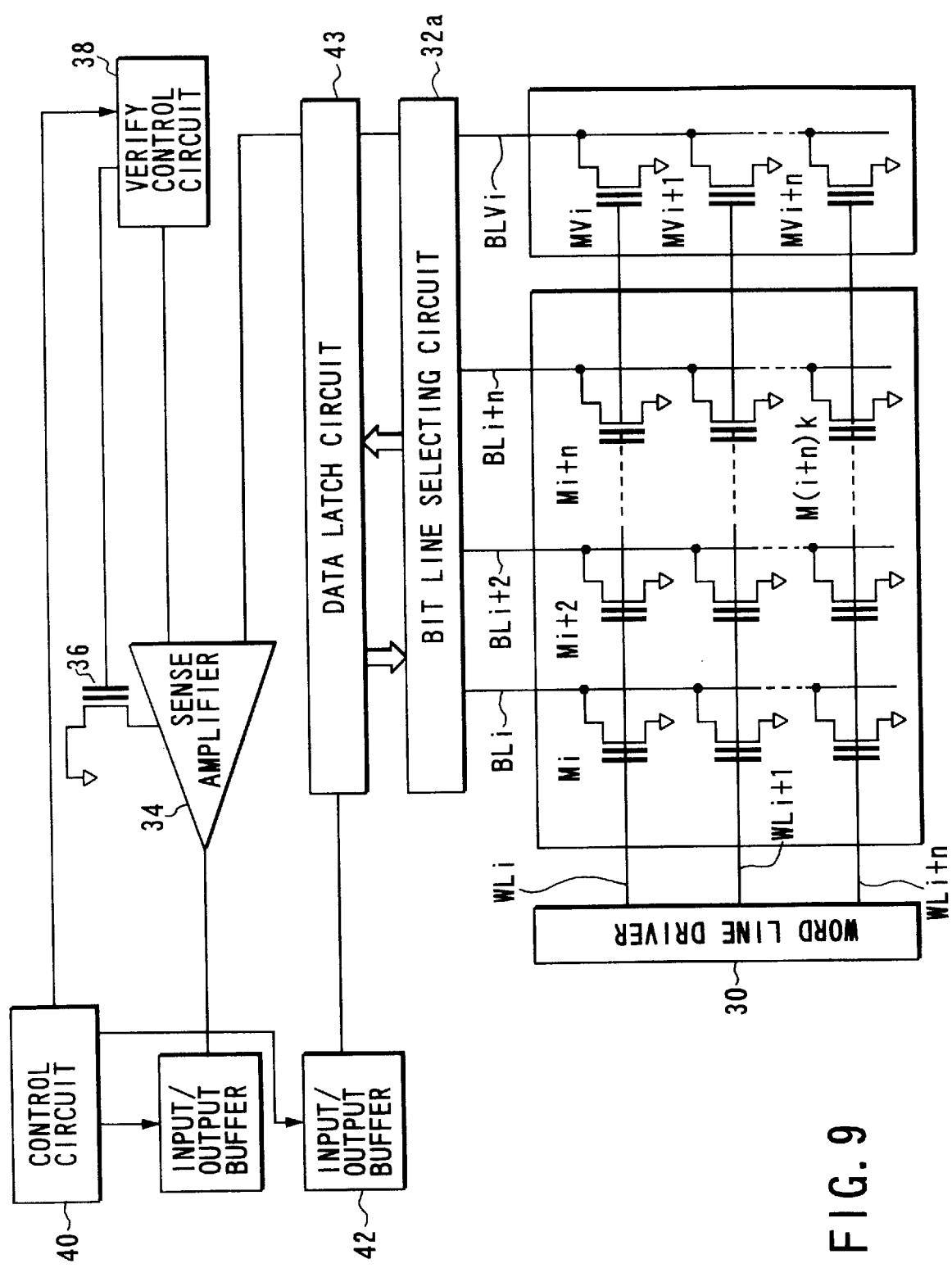
FIG. 9 is a block diagram depicting still another embodiment of the invention.

FIG. 9 shows a modification of the embodiment illustrated in FIG. 8. The modification has no component equivalent to the sense ratio control circuit 37a and is therefore more simple in structure. In the embodiment of FIG. 9, the output of a verify circuit 38 is supplied as a control signal to the gate of a reference cell transistor 36. The output level of the reference cell transistor 36 is thereby adjusted directly. The memory device of FIG. 9 is the same as the embodiment of FIG. 8, in other structural and operating features, which will not be described.

In each embodiment described above, the array cells connected to each word line can be verified by verifying only the verify cell connected to the word line. The verification time can be shortened very much. Further, the nonvolatile memory cells can be manufactured by the ordinary manufacturing process. This is because a part of the redundancy cell array formed simultaneously with the memory cell array can be used as the verify cell column 33. Still further, the circuit components used to accomplish verification can be simple in structure. Hence, each embodiment can be manufactured at low cost and can have a small chip size.

The memory cells, reference cells and verify cells incorporated in each of the embodiments described above are identical in structure and, therefore, in their threshold characteristic. Nonetheless, the present invention can be applied to a memory device in which the memory cells differ from the verify cells in terms of threshold characteristic. In such a case, the sense ratio of the sense amplifier is varied in accordance with the threshold value of the memory cells and that of the verify cells, or is fixed at the value of 1. Then, verification can be accomplished.

Figure 10:
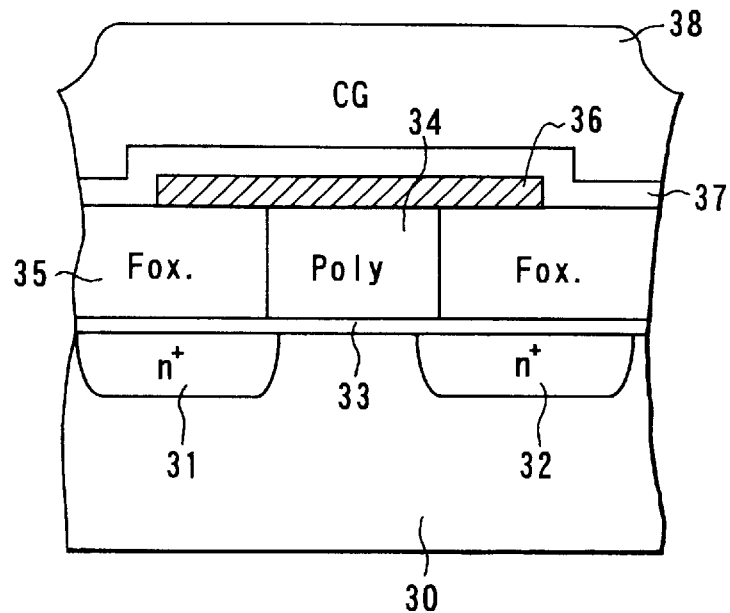
FIG. 10 is a sectional view of each memory cell incorporated in another embodiment of a invention.
Figure 11:
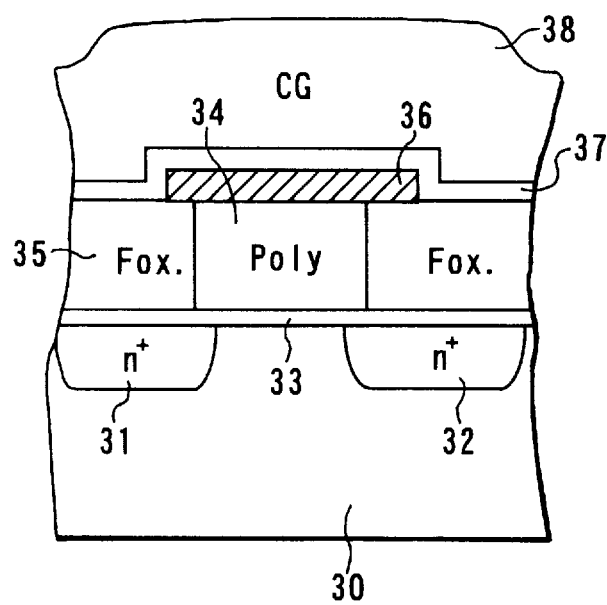
FIG. 11 is a sectional view of a verify cell incorporated in still another embodiment of the invention.

In the embodiment shown in FIG. 6, for example, the memory cells M1i, M1(i+1), and the verify cells Mv1 to Mv3 have such an EEPROM structure as is shown in FIGS. 10 and 11. Illustrated in FIGS. 10 and 11 are only the memory cell M1i and the verify cell Mv1, because the other memory cells are of the same structure as the cell M1i and the other verify cells are of the same structure as the cell Mv1. The memory cell M1i and the verify cell Mv1 are almost identical in structure. Their components which are identical are, therefore, designated at the same reference numerals and will be described together.

A drain region 51 and a source region 52, both being high impurity-concentration diffusion regions (n+1) doped with n-type impurity ions are formed on a p-type silicon substrate 50. A tunnel oxide film 53 is provided on the silicon substrate 50 which includes the drain region 51 and source region 52. A floating gate 54 made of polysilicon is provided on that part of the tunnel oxide film 53 which is located on the channel region provided between the drain region 51 and source region 52. Formed on the remaining part of the tunnel oxide film 53 is a field oxide film 55 which is made of silicon oxide.

A cap 56 made of polysilicon is provided on the surface of the field oxide film 55, covering the exposed surface of the floating gate 54 and positioned above the drain region 51 and source region 52. Formed on the cap 56 and the field oxide film 55 is an ONO film 57 which is an insulating layer consisting of an silicon oxide film and a nitride oxide film laid on the silicon oxide film. A control gate 58 made of polysilicon is provided on the ONO film 57.

The memory cell M1i and the verify cell Mv1 shown in FIGS. 10 and 11, respectively, are different in the dimensions of the cap 56. In the memory cell M1i shown in FIG. 10, the cap 56 has a length Lx1 measured in the direction the drain region 51 and source region 52 are arranged, and a length Ly1 measured along a line extending at right angles to that direction. It therefore has a cap area S1 expressed as Lx1×Ly1.

By contrast, the verify cell Mv1 shown in FIG. 11, the cap 56 has a length Lx2 measured in the direction the drain region 51 and source region 52 are arranged, and a length Ly2 measured along a line extending at right angles to that direction. Thus, the verify memory cell Mv1 has a cap area S2 expressed as Lx2×Ly2. Hence, the areas S1 of the cap 56 of the memory cell M1i and the area S2 of the cap 56 of the verify cell Mv1 have the relationship of: S1>S2.

In the memory cell M1i and verify cell Mv1, both having the structure described, the gate coupling ratio of the verify cell Mv1 is smaller than the gate coupling ratio of the mecapacitan M1i. The greater the capacitance between the channel region and the floating gate 54 and the capacitance between the floating gate 54 and the control gate 58, the greater the gate coupling ratio of either cell.

The area over which the channel region overlaps the floating gate 54 in the memory cell M1i of FIG. 10 is equal to the area over which the channel region overlaps the floating gate 54 in the verify cell Mv1 of FIG. 11. The memory cell and the verify cell therefore have the same capacitance between the channel region and the floating gate 54. On the other hand, the area S1 over which the floating gate 54 overlaps the control gate 58 in the memory cell M1i is larger than the area S2 over which the floating gate 54 overlaps the control gate 58 in the verify cell Mv1. Therefore, the capacitance between the floating gate 54 and control gate 58 of the memory cell M1i is larger than the capacitance between the floating gate 54 and control gate 58 of the verify cell Mv1.

The gate coupling ratio of the memory cell M1i is greater than the gate coupling ratio of the verify cell Mv1. As mentioned above, the verify cell Mv1 incorporated in the semiconductor device and having a gate coupling ratio different from that of the memory cell M1i. The memory cells M1i, M1(i+1), . . . connected to the word line WLi to which the verify cell Mv1 is connected can be verified, merely by verifying the verify cell Mv1.

The same holds true for the other word lines WLi+1 and WLi+2. Simply sated, the cells having different coupling ratios may be most easily manufactured by adjusting the surface areas of the tunnel oxide film and floating gate.

That is, in the structure of FIGS. 10 and 11 the polysilicon cap 56 indicated by hatching may be made shorter than the array cell by using a specially designed photomask. Obviously, the verify cells can then have a smaller coupling ratio than the array cells.

As described above, data is written into or erased from each memory cell by using a Fowler-Nordheim tunnel current (hereinafter referred to as "F-N current") or by performing hot electron injection (hereinafter referred to as "HE injection." A verify cell Mv1 identical to the array memory cell was prepared, which has a gate coupling ratio smaller than that of the memory cell. These cells Mv1 were tested to determine how the threshold characteristics are changed by injecting electrons into their floating gates 54, by pulling electrons therefrom, and by injecting hot electrons into their floating gates 54. The results were as is shown in FIGS. 12A, 12B and 12C.

Figure 12A:
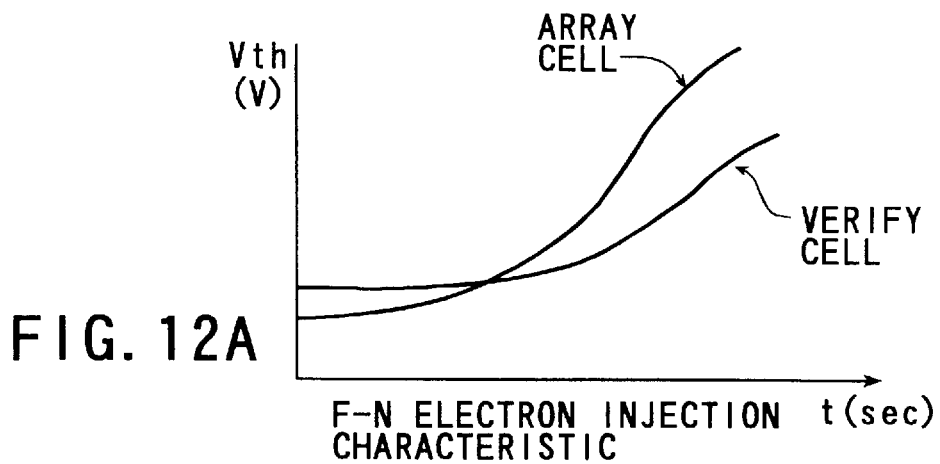
FIGS. 12A to 12C are graphs explaining the operation of an embodiment which has cells of the type shown in FIGS. 10 and 11.
Figure 12B:
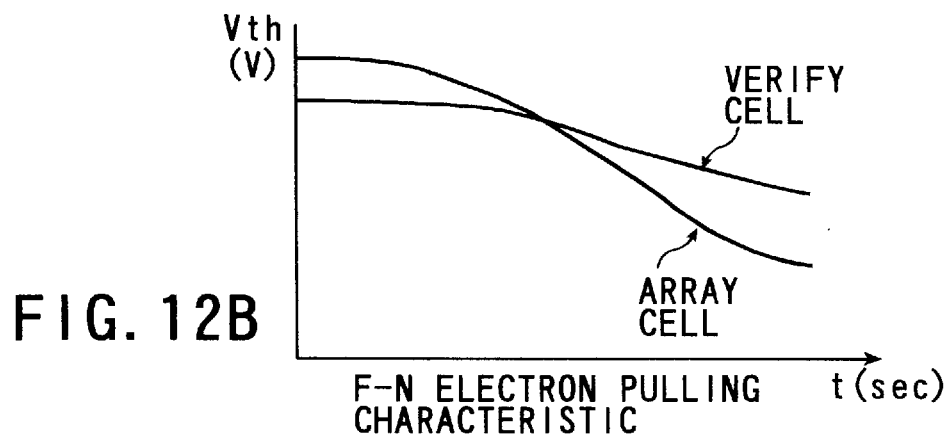
Figure 12C:
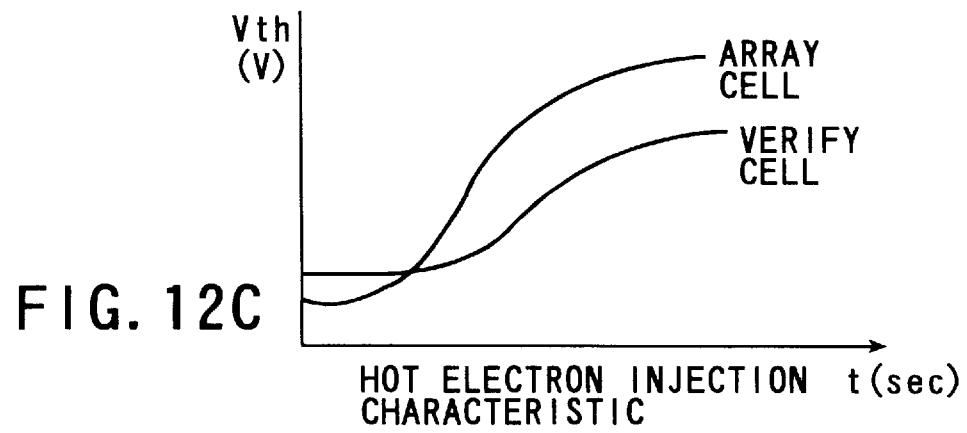

As is clear from FIGS. 12A, 12B and 12C, the greater any array cell has the couple ratio, the faster its threshold value Vth changes, no matter whether an F-N current is used or HE injection is carried out. Upon lapse of a predetermined time, the array cells come to have different threshold values. This characteristic of the array cells is utilized, whereby the writing of data into, and the erasing of data from, the verify cell Mv1 are verified to verify the memory cells connected to the word lines WLi, WLi+1, WLi+2, . . .

Program verification will be explained. At first, data writing is effected. Namely, the word line driver 30 shown in FIG. 6 selects the word line WLi. A select voltage is thereby applied to the word line WLi. At the same time, the bit line selecting circuit 32 selects the select transistors 28v, 28n and 28n(i+1) connected the bit lines Blvi, Bli and BLi+1, respectively. A write voltage is thereby applied to the bit lines BLi, BLi+1, . . . and to the bit line BLvi.

Data, e.g., "1," is thereby written into any memory cell selected and the verify cell Mv1. Namely, a select voltage and write voltage are applied to the selected memory cell and the verify cell for a prescribed period. Threshold values falling within a prescribed range are thereby imparted to any memory cell selected and the verify cell Mv1.

When verification may be started after this data-writing operation, the word driver 30 selects the verify cell Mv1 connected to the word line VLi. A verify voltage is therefore applied to the verify cell Mv1. The verify voltage corresponds to the threshold value of the verify cell Mv1 which has been programmed as will be explained later.

Thereafter, the bit line selecting circuit 32 selects the select transistor 28v which is connected to the bit line BLvi.

The output of the programmed verify cell Mv1 is thereby supplied to the sense amplifier 34. Since the reference cell 36 remains on during the verification, the output of the reference cell 36 is supplied to the sense amplifier 34. The sense amplifier 34 compares the reference output with the output of the verify cell Mv1 at a sense ratio of 1.

If the verify cell Mv1 is correctly programmed, the output of the verify cell Mv1 is at a level higher than the reference output. The sense amplifier 34 generates an output "1" which indicates that the verify cell Mv1 has been correctly programmed. If the verify cell Mv1 is not correctly programmed, the output of the verify cell Mv1 is at a level lower than the reference output. In this case, the sense amplifier 34 generates an output "0" which indicates that the verify cell Mv1 has not been correctly programmed.

The programming and the verification are performed repeatedly, and the programming is terminated when the sense amplifier 34 generates an output "1," indicating that the verify cell Mv1 has been correctly programmed.

Erase verification is carried out, in substantially the same manner as the write verification, as will be explained below. Data erasing is effected for the common source or the common well. More specifically, an erase gate voltage is applied to the word lines WLi, WLi+1, . . . and an erase well voltage is applied to the common source and/or an erase voltage is applied to the common source.

The data is thereby erased from the memory cells and the verify cells. To erase data, the select voltage and the erase voltage are applied for a predetermined time, imparting prescribed threshold values to the memory cells and the verify cells. After the erase operation is completed, verification is started. Namely, the verify cells connected to the word lines connecting the memory cells from which data has been erased are selected, one after another, by the word line driver 30. A verify voltage is therefore applied to the verify cells.

The verify voltage corresponds to the threshold voltage which the verify cells have during the erasing of data, as will be described later. When the bit line selecting circuit 32 selects the select transistor 28v connected to the bit line Blvi, the output of any verify cell from which data has been erased is supplied to the sense amplifier 34. In this verification, the reference cell 36 remains on, and the sense amplifier 34 set at a sense ratio of 1 compares the reference output of the cell 36 with the output of the verify cell.

If the data has been correctly erased from the verify cell, the output of the verify cell is at a level lower than, for example, the reference output. The sense amplifier 34 generates an output "0" which indicates that the data has been correctly erased from the verify cell. If the data has not been correctly erased from the verify cell, the output of the verify cell is at a level higher than the reference output. In this case, the sense amplifier 34 generates an output "1" which shows that the data has not been correctly erased from the verify cell.

Thus, it is verified whether or not data has been erased from each verify cell. As indicated above, the memory cells connected to the word line WLi are verified as to whether they have been programmed or whether data has been erased from them, by verifying the verify cell connected to the same word line WLi.

Figure 13A:
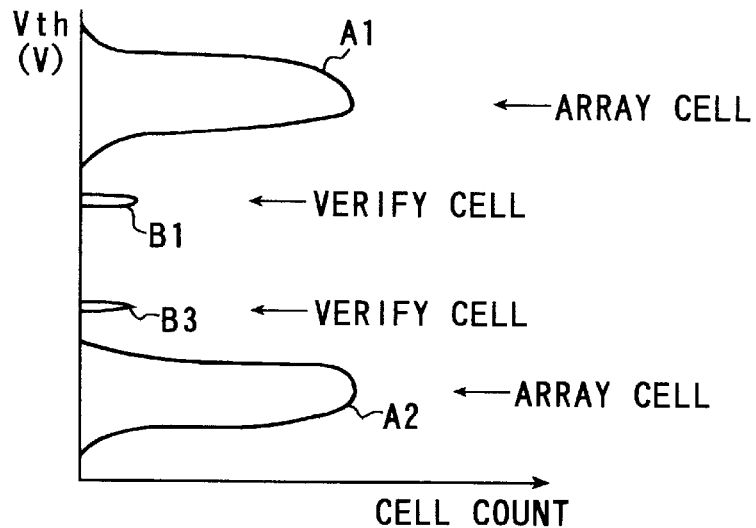
FIGS. 13A to 13C are graphs explaining the operation of the embodiment which has the cells shown in FIGS. 10 and 11.

This is based on the following reason. FIG. 13A shows the distribution of the threshold values of a number of cells. Plotted on the abscissa is the cell count, i.e., the number of cells. Plotted on the ordinate is the threshold voltage Vth. Curve A1 represents the distribution of threshold value of the memory cell M1i which is observed when electrons are injected into the floating gate 54. Curve B1 indicates the distribution of threshold value of the verify cell Mv1 which is observed when electrons are injected into the floating gate 54.

Curve A2 shows the distribution of threshold value of the memory cell M1i which is observed when electrons are pulled from the floating gate 54. Curve B2 indicates the distribution of threshold value of the verify cell Mv1 which is observed when electrons are pulled from the floating gate 54. As is clear from the curves A1 and B1 illustrated in FIGS. 12A and 13A, when electrons are injected into the floating gate 54, the threshold value of the memory cell M1i having a coupling ratio greater than the verify cell reaches a higher level, provided that the threshold value of the verify cell Mv1 rises to a prescribed value. This is because the threshold value of the memory cell M1i changes faster than that of the verify cell Mv1.

That is, all other memory cells connected to the same word line have threshold values which are greater than that of the verify cell Mv1. This is proved by determining whether or not the verify cell Mv1 is turned on at its threshold value. Thus it is unnecessary to detect whether the memory cells connected to the same word line become ON as the verify cell Mv1 are turned on or not at that threshold value.

As can be understood from the curves A2 and B2 shown in FIGS. 12A and 13A, the array cells reach a smaller threshold value when electrons are pulled from the floating gate 54, provided that the threshold value of the verify cell decreases to a certain value. This is because the array cells have a coupling ratio grater than the verify cell and their threshold values change faster than that of the verify cell. Hence, if the verify cell is found to have been turned on at its threshold value, it will be determined that the memory cells have specific threshold values which are less than the threshold value of the verify cell. It is therefore unnecessary to detect whether or not the memory cells connected the same word line become ON as the verify cell have been turned on at their threshold values.

In view of this principle, the verification of the memory cells is accomplished by verifying only one verify cell connected to the same word line WLn as the memory cells. The same distribution of threshold value of the cells as indicated by the curves A1 and B1 in FIG. 13A is observed in the case where hot electrons are injected into the floating gates 54. It follows that many memory cells can be verified once the verify cells are verified when hot electrons are injected to write data into the memory cells or are pulled therefrom to erase data.

The reference cell 36 may be of the same type as the array memory cells and has the same coupling ratio as the array memory cells. If so, the sense ratio of the sense amplifier 34, which is applied to adjust the offset with the verify cell, is checked and adjusted in a TEG process. Verification can then be accomplished by the method explained with reference to FIGS. 6 to 9. The reference cell 36 may be of the same type as the verify cell. In this case, the reference cell 36 can be more easily adjusted.

Figure 13B:
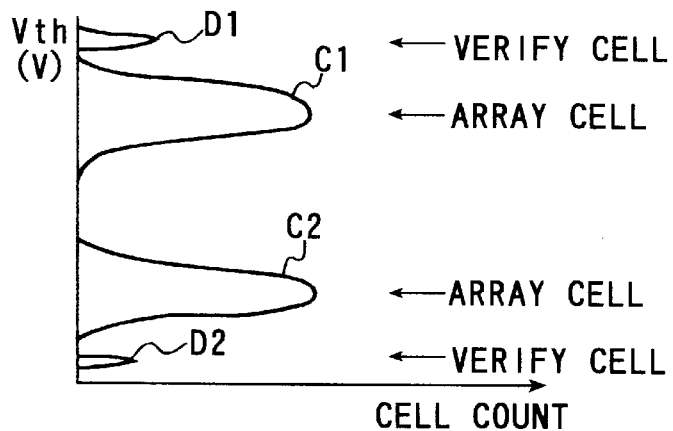
Figure 13C:
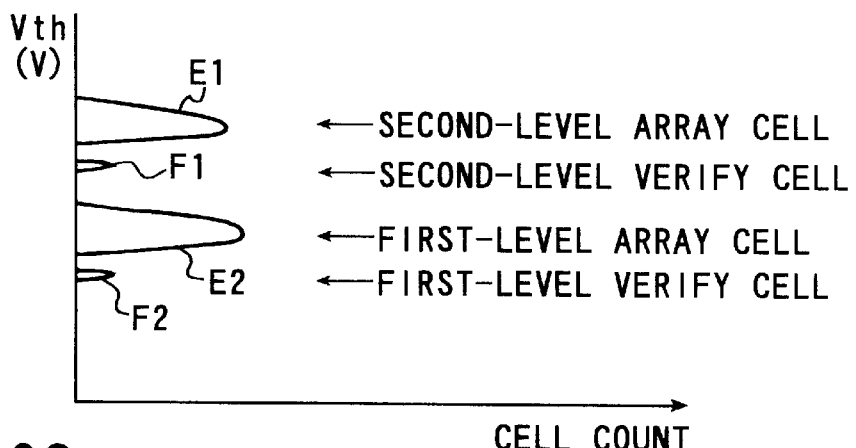

In view of the foregoing, the present invention can be applied as follows:

(1) A bit line is added to which verify cells having a coupling ratio greater than that of the array cells is connected. The verify cells can be used to check the over-erasing and over-programming of the array cells. That is, as shown in FIG. 13B, the verify cells and the array cells have threshold value distributions which differ from those illustrated in FIG. 13A.

The threshold value of the memory cells and that of the verify cells have a specific relationship at a certain time if electrons are injected into their floating gates. As the curves C1 and D1 clearly indicate, when the threshold value of a memory cell increases to a certain value, a verify cell has already reached a higher threshold level. This is because the verify cell has a larger coupling ratio than the memory cell, and its threshold value changes faster than that of the memory cell. If electrons are pulled from the floating gates 54 of the memory cells and verify cells, the threshold value of the memory cells and that of the verify cells have another specific relationship at a certain time. As the curves C2 and D2 clearly show, when the threshold value of a memory cell decreases to a certain value, a verify cell has already reached at lower threshold level because the verify cell has a larger coupling ratio than the memory cell and its threshold value changes faster than that of the memory cell.

The verify cells shown in FIG. 6 may have a greater coupling ratio than the array cells. If so, the verify cells can be used to check the over-erasing and over-programming of the memory cells.

It will be explained how the over-erasing and over-programming of the memory cells are verified.

First, pulses are supplied to a cell having a large coupling ratio, in an number large enough to program or erase standard memory cells, thereby setting this memory cell at a particular threshold value.

Next, memory cells and a verify cell provided to verify the memory cells are programmed, or data is erased from the memory cells and the verify cell. The verify cell is therefore verified. Thereafter, the memory cells are compared with the cell having a large coupling ratio, in terms of threshold value. In other words, their threshold values are verified. When a voltage is applied to the memory cells and the cell to increase the threshold values thereof, the memory cells will have a threshold value smaller than that of the cell having a greater coupling ratio, if they are ordinary memory cells. If the memory cells exhibit a larger threshold value than the cell having a greater coupling ratio, their threshold value is considered to be excessively large. When a voltage is applied to decrease the threshold values of the memory cells and the cell, the threshold value of the memory cells is considered too large if it is smaller than the threshold value of the cell having a greater coupling ratio.

If the memory cells exhibit an excessively large or small threshold value, it means that the electric charge applied to the floating gates of the memory cells is of an abnormal value. Generally, such a cell is likely to be depleted of an electric charge. If the charge has an abnormal value, an abnormal electric field will be applied to the tunnel oxide film, inevitably deteriorating the memory cell. Any memory cell that may likely be deteriorated can be detected if checked for over-erasing or over-programming.

(2) In the circuit shown in FIG. 6, the memory cells may be classified into first-level cells having a threshold value and second-level cells having a different threshold value, and at least two bit lines may be provided to which first-type verify cells and second-type verify cells are connected, respectively. A multi-valued memory can then be provided. To manufacture the multi-valued memory wherein different voltages are applied to the word lines, the first-level memory cells are verified by the first-type verify cells, and the second-level cells are verified by the second-type verify cells. In this case, the first-type verify cells and the second-type verify cells need not have the same coupling ratio.

As has been described above in detail, the present invention can provide a nonvolatile memory device with verify function, in which verification can be conducted fast and accurately, thereby to write and erase data with ease, accuracy and high speed, and more particularly a nonvolatile memory device in which verification can be accomplished in units of word lines, that is, in units of pages.

I claim:

1. A nonvolatile memory device with verify function, comprising;

a plurality of word lines arranged in row direction;

a plurality of bit lines arranged in column direction, intersecting with the word lines;

a plurality of nonvolatile memory cells provided at intersections of the word lines and bit lines;

at least one nonvolatile verify cell connected to one word line, along with some of the nonvolatile memory cells, and having substantially the same threshold value as the nonvolatile memory cells;

threshold control means for electrically decreasing the threshold value of the nonvolatile verify cell by a predetermined value with respect to the threshold value of the nonvolatile memory cells, before data-writing operation or data-erasing operation; and verification means for verifying contents of the nonvolatile verify cell upon lapse of a predetermined time from changes in threshold value made by the threshold control means.

2. A nonvolatile memory device with verify function, according to claim 1, further comprising means for writing data into, reading data from, and erasing data from, the nonvolatile memory cells connected to one word line, in units of pages.

3. A nonvolatile memory device with verify function, comprising;

a plurality of word lines arranged in row direction;

a plurality of bit lines arranged in column direction, intersecting with the word lines;

a plurality of nonvolatile memory cells provided at the intersections of the word lines and bit lines;

at least one nonvolatile verify cell connected to one of said plurality of word lines, along with some nonvolatile memory cells;

voltage-applying means for applying a prescribed voltage to the nonvolatile memory cells to write or erase data and for applying a voltage lower than this voltage to the nonvolatile verify cell; and verification means for verifying contents of the nonvolatile verify cell upon lapse of a predetermined time.

4. A nonvolatile memory device with verify function, according to claim 3, wherein said nonvolatile memory cells and said nonvolatile verify cell have substantially the same write time and erase time characteristics with respect to said prescribed voltage applied from said voltage-applying means to write data into and erase data from said nonvolatile memory cells and said nonvolatile verify cell.

5. A nonvolatile memory device with verify function, according to claim 3, further comprising first current-supplying means for supplying a current to said nonvolatile memory cells to write data or erase data and second current-supplying means for supplying a current to said nonvolatile verify cell, said first current-supplying means having a greater drive ability than said second current-supplying means.

6. A nonvolatile memory device with verify function, according to claim 3, wherein said voltage-applying means has a single power supply, first drive means connected between the power supply and said nonvolatile memory cells, for generating said prescribed voltage, and second drive means connected between the power supply and said nonvolatile verify cell, for generating a voltage lower than said prescribed voltage.

7. A nonvolatile memory device with verify function, according to claim 3, wherein said voltage-applying means has a first power supply for generating the prescribed voltage and a second power supply for generating a voltage smaller than the prescribed voltage.

8. A nonvolatile memory device with verify function, according to claim 3, characterized in that said verification means has a reference cell for generating a reference output for verifying contents of said nonvolatile verify cell, and a sense amplifier for comparing the reference output of the reference cell with contents of said nonvolatile verify cell, thereby to generate a result of a comparison of the sense amplifier.

9. A nonvolatile memory device with verify function, comprising:

a plurality of word lines arranged in row direction;

a plurality of bit lines arranged in column direction, intersecting with the word lines;

a plurality of nonvolatile memory cell transistors provided at the intersections of the word lines and bit lines;

at least one nonvolatile verify cell transistor connected to one word line, along with the nonvolatile memory cell transistors;

voltage-applying means for applying a prescribed voltage to drains, sources or substrate of said nonvolatile memory cell transistors to write or erase data and for applying a voltage lower than this voltage to drain, source or substrate of the nonvolatile verify cell transistor; and verification means for verifying contents of said nonvolatile verify cell transistor after data has been written into or erased from said nonvolatile memory cell transistors.

10. A nonvolatile memory device with verify function, according to claim 9, wherein said verification means repeats said verification a predetermined number of times, until a threshold value of said nonvolatile verify cell transistor reaches a prescribed value.

11. A nonvolatile memory device with verify function, comprising:

a plurality of word lines arranged in row direction;

a plurality of bit lines arranged in column direction, intersecting with the word lines;

a plurality of nonvolatile memory cells provided at the intersections of the word lines and bit lines;

at least one nonvolatile verify cell connected to one word line, along with the nonvolatile memory cells, and having substantially the same write and erase characteristic as the nonvolatile memory cells;

a reference cell for generating a reference signal; and sense means for detecting the output of the verify cell connected to the word line selected to write or erase data and also the reference signal output from the reference cell, with different sensitivities, respectively.

12. A nonvolatile memory device with verify function, according to claim 11, wherein said verify cell is a part of a redundancy cell array which has been formed simultaneously with said nonvolatile memory cells.

13. A nonvolatile memory device with verify function, according to claim 11, wherein said sense means comprises first supply means for supplying an output of said verify cell directly to said sense means to accomplish verification, and second supply means for adjusting the level of the reference signal from said reference cell and supplying the reference signal to said sense means.

14. A nonvolatile memory device with verify function, according to claim 11, wherein said sense means comprises first supply means for supplying an output of said verify cell directly to said sense means to accomplish verification, and second supply means for adjusting the level of the reference signal output by supplying a control signal to an output control terminal of said reference cell and supplying the reference signal to said sense means.

15. A nonvolatile memory device with verify function, according to claim 11, wherein said word lines, bit lines, memory cells, verify cell, reference cell and sense means are provided on a semiconductor chip, and said reference cell is arranged between said memory cell pattern and said sense amplifier.

* * * * *